(12) United States Patent
Karpov et al.

(10) Patent No.: US 10,396,211 B2
(45) Date of Patent: Aug. 27, 2019

(54) FUNCTIONAL METAL OXIDE BASED MICROELECTRONIC DEVICES

(71) Applicant: Intel Corporation, Santa Clara, CA (US)

(72) Inventors: Elijah V. Karpov, Santa Clara, CA (US); Prashant Majhi, San Jose, CA (US); Roza Kotlyar, Portland, OR (US); Niloy Mukherjee, Portland, OR (US); Charles C. Kuo, Hillsboro, OR (US); Uday Shah, Portland, OR (US); Ravi Pillarisetty, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/747,925

(22) PCT Filed: Jul. 31, 2015

(86) PCT No.: PCT/US2015/043166
§ 371 (c)(1),
(2) Date: Jan. 26, 2018

(87) PCT Pub. No.: WO2017/023253
PCT Pub. Date: Feb. 9, 2017

(65) Prior Publication Data
US 2018/0226509 A1    Aug. 9, 2018

(51) Int. Cl.
*H01L 29/786* (2006.01)
*H01L 27/07* (2006.01)
(Continued)

(52) U.S. Cl.
CPC ...... *H01L 29/7869* (2013.01); *H01L 27/0705* (2013.01); *H01L 27/1225* (2013.01);
(Continued)

(58) Field of Classification Search
CPC ............. H01L 29/7369; H01L 27/0705; H01L 29/7869
USPC ........................................................ 257/43
See application file for complete search history.

(56) References Cited

U.S. PATENT DOCUMENTS 6,473,332 B1   10/2002   Ignatiev et al.
2002/0079507 A1   6/2002   Shim et al.
(Continued)

FOREIGN PATENT DOCUMENTS

JP   2013175717   9/2013
WO   2009017305   2/2009

OTHER PUBLICATIONS

International Preliminary Report on Patentability for International Patent Application No. PCT/US15/43166, dated Feb. 15, 2018.
(Continued)

*Primary Examiner* — Igwe U Anya
(74) *Attorney, Agent, or Firm* — Green, Howard & Mughal LLP

(57) ABSTRACT

A microelectronic device having a functional metal oxide channel may be fabricated on a microelectronic substrate that can be utilized in very large scale integration, such as a silicon substrate, by forming a buffer transition layer between the microelectronic substrate and the functional metal oxide channel. In one embodiment, the microelectronic device may be a microelectronic transistor with a source structure and a drain structure formed on the buffer transition layer, wherein the source structure and the drain structure abut opposing sides of the functional metal oxide channel and a gate dielectric is disposed between a gate electrode and the functional metal oxide channel. In another embodiment, the microelectronic device may be a two-terminal microelectronic device.

26 Claims, 5 Drawing Sheets

(51) Int. Cl.
  *H01L 29/02* (2006.01)
  *H01L 29/49* (2006.01)
  *H01L 27/12* (2006.01)
  *H01L 45/00* (2006.01)
  *H01L 27/24* (2006.01)
(52) U.S. Cl.
  CPC .......... *H01L 27/2436* (2013.01); *H01L 29/02* (2013.01); *H01L 29/4908* (2013.01); *H01L 29/78603* (2013.01); *H01L 29/78642* (2013.01); *H01L 45/04* (2013.01); *H01L 45/1206* (2013.01); *H01L 45/1233* (2013.01); *H01L 45/145* (2013.01); *H01L 45/146* (2013.01)

(56) References Cited

U.S. PATENT DOCUMENTS

| | | | |
|---|---|---|---|
| 2008/0106926 A1 | 5/2008 | Brubaker et al. | |
| 2010/0213477 A1 | 8/2010 | Xu et al. | |
| 2011/0168993 A1* | 7/2011 | Jeon | H01L 29/7869 257/43 |
| 2012/0104350 A1 | 5/2012 | Himeno et al. | |
| 2015/0001534 A1 | 1/2015 | Chang et al. | |
| 2015/0084035 A1* | 3/2015 | Kim | H01L 29/78606 257/43 |
| 2015/0102324 A1* | 4/2015 | Lee | H01L 27/3244 257/40 |
| 2015/0206932 A1* | 7/2015 | Cha | H01L 27/124 257/40 |
| 2015/0243723 A1* | 8/2015 | Cho | H01L 27/124 257/43 |

OTHER PUBLICATIONS

International search Report and Written Opinion for International Patent Application No. PCT/US2015/043166, dated Apr. 29, 2016.
Extended European Search Report dated Jun. 3, 2019 for EP Patent Application No. 15900522.2.

* cited by examiner

FUNCTIONAL METAL OXIDE BASED MICROELECTRONIC DEVICES

CLAIM OF PRIORITY

This Application is a National Stage Entry of, and claims priority to, PCT Application No. PCT/US15/43166, filed on 31 Jul. 2015 and titled "FUNCTIONAL METAL OXIDE BASED MICROELECTRONIC DEVICES", which is incorporated by reference in its entirety for all purposes.

TECHNICAL FIELD

Embodiments of the present description relate to the field of microelectronic devices, and, more particularly, to the fabrication of function metal oxide channels in microelectronic devices on microelectronic substrates, such as silicon microelectronic substrates.

BACKGROUND

The microelectronics industry is continually striving to produce ever faster and smaller microelectronic devices for use in various electronic products, including, but not limited to, computer server products and portable products, such as laptop/netbook computers, electronic tablets, smart phones, digital cameras, and the like. This has prompted the investigation of the use of a variety of materials to form such microelectronic devices to achieve these goals. One class of materials that may have promise for use as a channel material is functional metal oxides, as such materials may undergo bi-stable (non-volatile) or mono-stable (volatile) insulator-metal phase transition at low voltage. However, such functional metal oxides cannot be formed directly on common microelectronic substrates, such as silicon substrate, and require exotic substrates, such as titanium dioxide and sapphire for their formation. Thus, as functional metal oxides are incompatible with common microelectronic substrates, they cannot be incorporated effectively into very large scale integration (VLSI) manufacturing. Furthermore, liquid electrolytes are required between such metal oxides and electrodes in the microelectronic device, as there are no device quality high-k/metal electrode stacks currently available to induce an insulator-metal phase transition. Therefore, there is a need for processes and structures for the incorporation of functional metal oxides on common microelectronic substrates, such as silicon substrates, for use in microelectronic devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
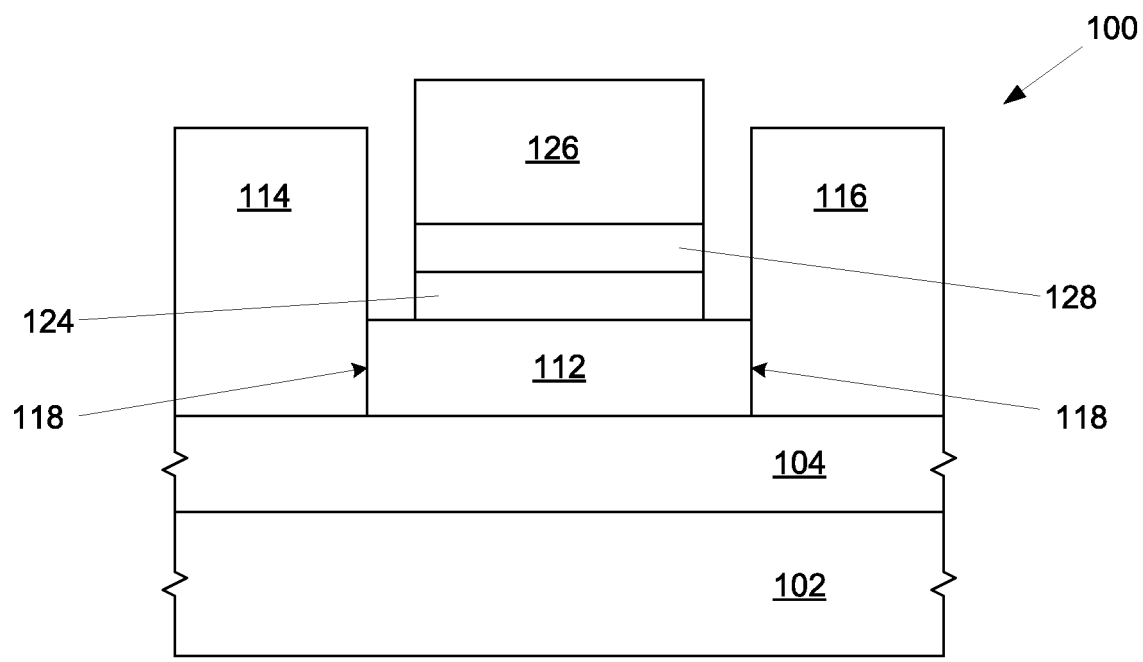
FIG. 1 illustrates side cross sectional view of a microelectronic transistor having a functional metal oxide channel, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer or component with respect to other layers or components. One layer/component "over" or "on" another layer/component or bonded "to" another layer/component may be directly in contact with the other layer/component or may have one or more intervening layers/components. One layer/component "between" layers/components may be directly in contact with the layers/components or may have one or more intervening layers/components.

FIG. 1 illustrates a microelectronic device 100, specifically a transistor (e.g. a three terminal device), utilizing a functional metal oxide channel 112, according to one embodiment of the present description. The microelectronic device 100 may include a microelectronic substrate 102 having a buffer transition layer 104 thereon. The functional metal oxide channel 112, a source structure 114, and a drain structure 116 may be formed on the buffer transition layer 104, wherein the source structure 114 and the drain structure 116 abut opposing sides 118 of the functional metal oxide channel 112. A gate dielectric 124 may be formed on the function metal oxide channel 112 and a gate electrode 126 may be formed over the gate dielectric 124. As illustrated in FIG. 1, a high work function metal 128 may be disposed between the gate dielectric 124 and the gate electrode 126 to improve the performance of the microelectronic device 100, as will be understood to those skilled in the art. The functions and fabrication processes for the components of the microelectronic device 100 are well known in the art and for the sake of conciseness and clarity will not be discussed herein.

The microelectronic substrate 102 may be a bulk substrate composed of a single crystal of a material which may include, but is not limited to, silicon, germanium, silicon-germanium or a III-V compound semiconductor material. In one embodiment, the microelectronic substrate 102 may be crystal silicon having a diamond cubic structure, wherein the crystal silicon is orientation with (100) faces, as will be understood to those skilled in the art.

The buffer transition layer 104 may comprise any appropriate material, which may provide may buffer and/or transition the crystal lattice from the microelectronic substrate 102 to the functional metal oxide channel 112 to allow for the formation thereof. The buffer transition layer 104 may include, but is not limited to amorphous oxides, sapphire, and strontium titanate ($SrTiO_3$).

The functional metal oxide channel 112 may be any appropriate metal oxide material which can induce an insulator-metal phase transition at a low voltage (e.g. voltage less than about 1.0 V). In one embodiment, the function metal oxide channel 112 may comprise niobium oxide ($NbO_2$). In another embodiment, the function metal oxide channel 112 may comprise vanadium oxide ($VO_2$).

The gate dielectric 124 may be formed from any well-known gate dielectric material, including but not limited to silicon dioxide ($SiO_2$), silicon oxynitride ($SiO_xN_y$), silicon nitride ($Si_3N_4$), and high-k dielectric materials, wherein the dielectric constant may comprise a value greater than about 4, such as hafnium oxide, hafnium silicon oxide, lanthanum oxide, lanthanum aluminum oxide, zirconium oxide, zirconium silicon oxide, tantalum oxide, tantalum silicon oxide, titanium oxide, barium strontium titanium oxide, barium titanium oxide, strontium titanium oxide, yttrium oxide, aluminum oxide, lead scandium tantalum oxide, and lead zinc niobate.

The gate electrode 126 may be formed with any appropriate conductive material. In one embodiment, the gate electrode 126 may comprise a metal, including, but not limited to, pure metal and alloys of titanium, tungsten, tantalum, aluminum, copper, ruthenium, cobalt, chromium, iron, palladium, molybdenum, manganese, vanadium, gold, silver, and niobium. In another embodiment, metal carbides, such as titanium carbide, zirconium carbide, tantalum carbide, tungsten carbide, and tungsten carbide, may be used to form the gate electrode 126. In still another embodiment, the gate electrode 126 may be formed from a conductive metal nitride, such as titanium nitride and tantalum nitride, or a conductive metal oxide, such as ruthenium oxide. In further embodiments, the gate electrode 126 may be formed as alloys with rare earths, such as terbium and dysprosium, or noble metals such as platinum.

The high work function metal 128 may be any appropriate metal having a work function greater than about 5 eV. The high work function metal 128 may comprise, but is not limited to, platinum, palladium, iridium, nickel, and alloys thereof.

Figure 2:
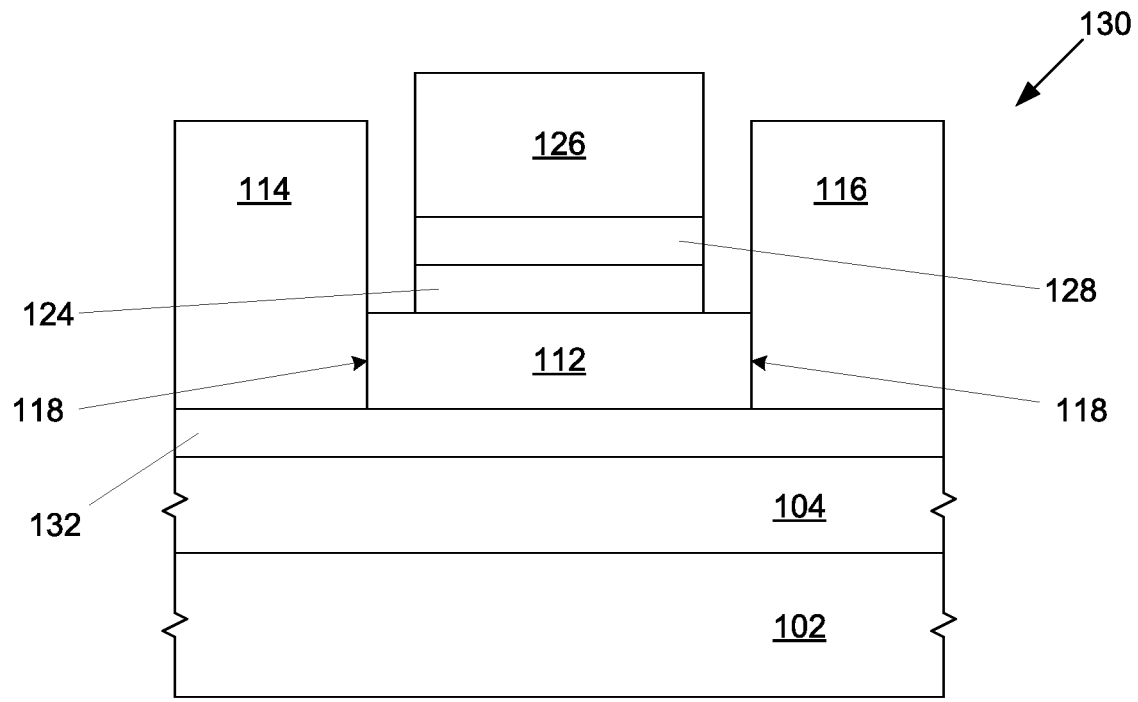
FIG. 2 illustrates side cross sectional view of a microelectronic transistor having a functional metal oxide channel, according to another embodiment of the present description.

FIG. 2 illustrates a microelectronic device 130, specifically a transistor, utilizing the functional metal oxide channel 112, according to another embodiment of the present description. The microelectronic device 130 of FIG. 2 is similar to the microelectronic device 100 of FIG. 1, but includes a buffer capping layer 132 disposed between the functional metal oxide channel 112 and the buffer transition layer 104. It is noted, that the source structure 114 and the drain structure 116 may be formed on the buffer capping layer 132. The buffer capping layer 132 may be formed to provide a structural surface which is better for forming the functional metal oxide channel 112 than the buffer transition layer 104. In one embodiment, the buffer capping layer 132 may comprise rutile titanium dioxide ($TiO_2$).

Figure 3:
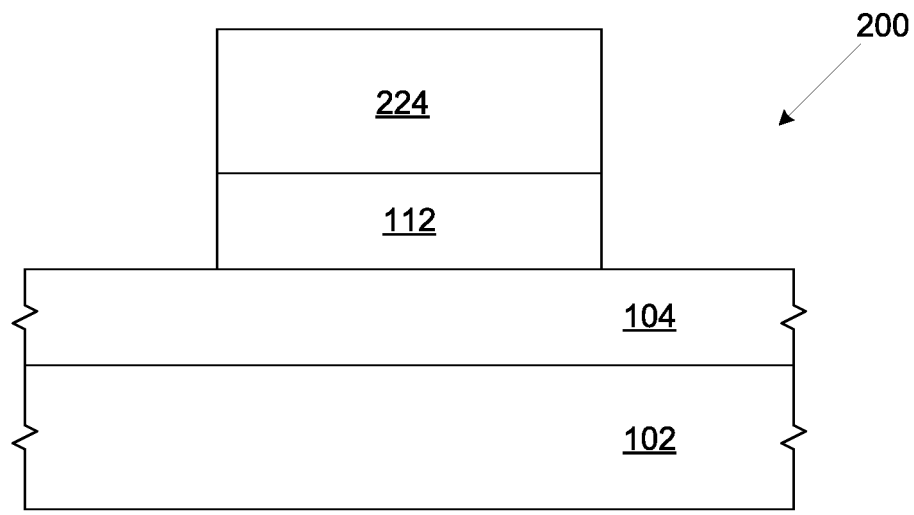
FIG. 3 illustrates side cross sectional view of a microelectronic device having a functional metal oxide channel, according to an embodiment of the present description.

FIG. 3 illustrates a microelectronic device 200 (i.e. two-terminal microelectronic device), according to still another embodiment of the present description. The microelectronic device 200 may comprise the microelectronic substrate 102 having the buffer transition layer 104 thereon. The functional metal oxide channel 112 may be formed on the buffer transition layer 104 and a first electrode 224 may be formed on the functional metal oxide channel 112. The microelectronic device 200 may used as a selector S1 (see FIG. 5) in a microelectronic circuit 210, which is illustrated in cross-section in FIG. 4 and as a circuit diagram in FIG. 5.

Figure 4:
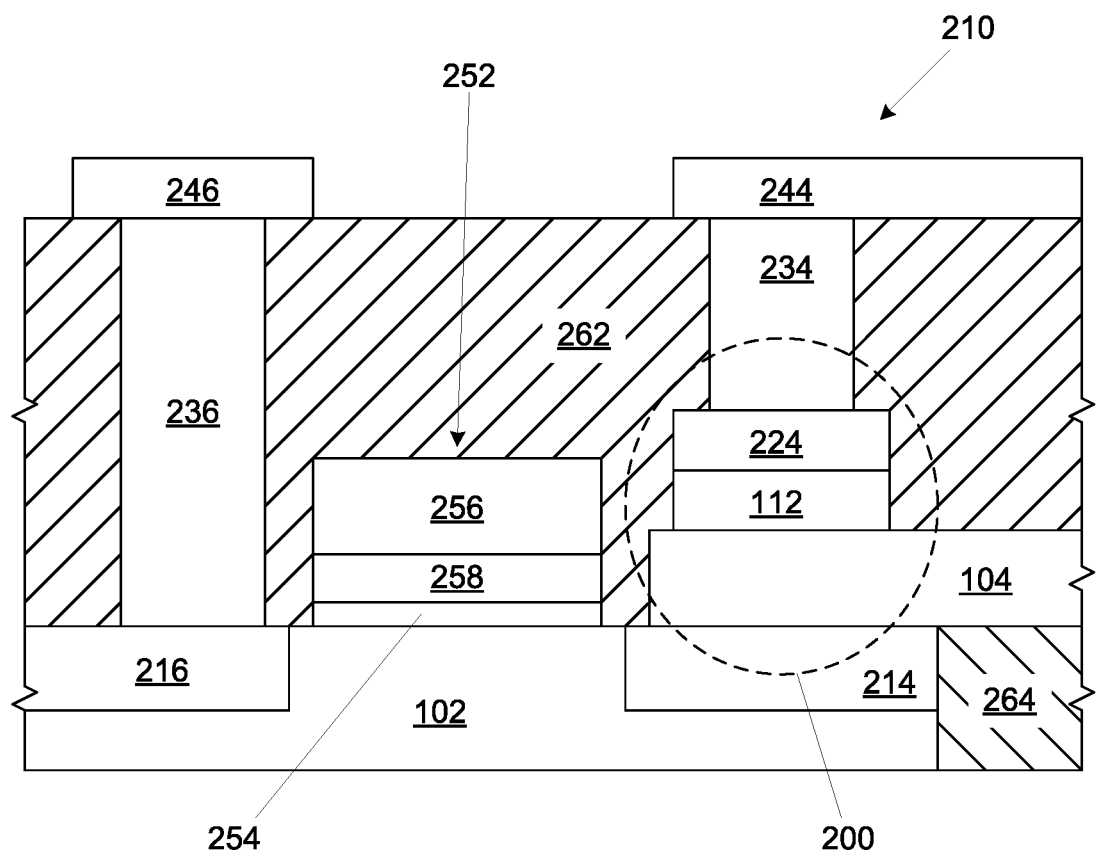
FIG. 4 illustrates side cross sectional view of a microelectronic structure incorporating the microelectronic device of FIG. 3, according to an embodiment of the present description.

As shown in FIG. 4, the microelectronic circuit 210 may comprise a microelectronic transistor gate 252 that may be formed on the microelectronic substrate 102. The microelectronic transistor gate 252 may include a gate electrode 256 with a gate dielectric 254 disposed between the gate electrode 256 and the microelectronic substrate 102. The microelectronic transistor gate 252 may further include a high work function metal 258 between the gate electrode 256 and the gate dielectric 254. A source region 214 and a drain region 216 may be formed in the microelectronic substrate 102, such as by ion implantation of appropriate dopants, on opposing sides of the microelectronic transistor gate 252. An interlayer dielectric material 262 may be disposed over the microelectronic transistor gate 252 and a drain contact 236 may be formed through the interlayer dielectric material 262 to electrically connect with the drain region 216. As illustrated the drain contact 236 may be electrically connected to a first metallization structure 246 formed on the interlayer dielectric material 262.

The microelectronic device 200 may be formed as part of the microelectronic circuit 210, such that the buffer transition layer 104 contacts the microelectronic substrate 102 at the source region 214 formed therein. A device contact 234 may extend through the interlayer dielectric material 262 to electrically contact the first electrode 224 and the device contact 234 may be electrically connected to a second metallization structure 244 formed on the interlayer dielectric material 262. As still further illustrated, an isolation structure 264, such as a shallow trench isolation structures, may be formed in the microelectronic substrate 102 to electrically isolate relevant components in electrical contact with the microelectronic substrate 102, as will be understood to those skilled in the art.

The gate electrode 256, the drain contact 236, the device contact 234, the first metallization structure 246, and/or the second metallization structure 244, may be formed with any appropriate conductive material. In one embodiment, the gate electrode 256 may comprise a metal, including, but not limited to, pure metal and alloys of titanium, tungsten, tantalum, aluminum, copper, ruthenium, cobalt, chromium, iron, palladium, molybdenum, manganese, vanadium, gold, silver, and niobium. In another embodiment, metal carbides, such as titanium carbide, zirconium carbide, tantalum carbide, tungsten carbide, and tungsten carbide, may be used to form the gate electrode 256. In still another embodiment, the gate electrode 256 may be formed from a conductive metal nitride, such as titanium nitride and tantalum nitride, or a conductive metal oxide, such as ruthenium oxide. In further embodiments, the gate electrode 256 may be formed as alloys with rare earths, such as terbium and dysprosium, or noble metals such as platinum.

The gate dielectric 254 may be formed from any well-known gate dielectric material, including but not limited to silicon dioxide ($SiO_2$), silicon oxynitride ($SiO_xN_y$), silicon nitride ($Si_3N_4$), and high-k dielectric materials, wherein the dielectric constant may comprise a value greater than about 4, such as hafnium oxide, hafnium silicon oxide, lanthanum oxide, lanthanum aluminum oxide, zirconium oxide, zirconium silicon oxide, tantalum oxide, tantalum silicon oxide, titanium oxide, barium strontium titanium oxide, barium titanium oxide, strontium titanium oxide, yttrium oxide, aluminum oxide, lead scandium tantalum oxide, and lead zinc niobate.

The high work function metal 258 may be any appropriate metal having a work function greater than about 5 eV. The interlayer dielectric material 262 may be any appropriate dielectric material, including, but not limited to, silicon dioxide, silicon nitride, and the like, and may be formed from a low-k (dielectric constant, k, such as 1.0-2.2) material.

Figure 5:
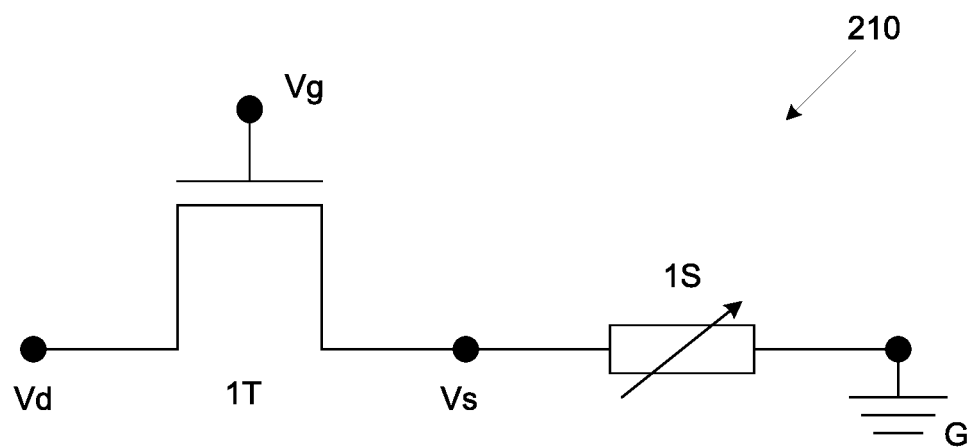
FIG. 5 illustrates a circuit diagram for the microelectronic structure of FIG. 4, according to an embodiment of the present description.

With regard to the circuit diagram of FIG. 5, a microelectronic transistor 1T would correspond to the structure comprising the microelectronic transistor gate 252, the source region 214, the drain region 216, and a portion of the microelectronic substrate 102 between the source region 214 and the drain region 216 of FIG. 4. A drain voltage Vd corresponds to a voltage at the drain region 216 of FIG. 4. A gate voltage Vg corresponds to a voltage at the gate electrode 256 of FIG. 4. A source voltage Vs corresponds to a voltage at the source region 214 of FIG. 4. The selector 1S corresponds to the microelectronic device 200 of FIG. 4. A voltage or ground G would correspond to the first electrode 224 being grounded.

Figure 6:
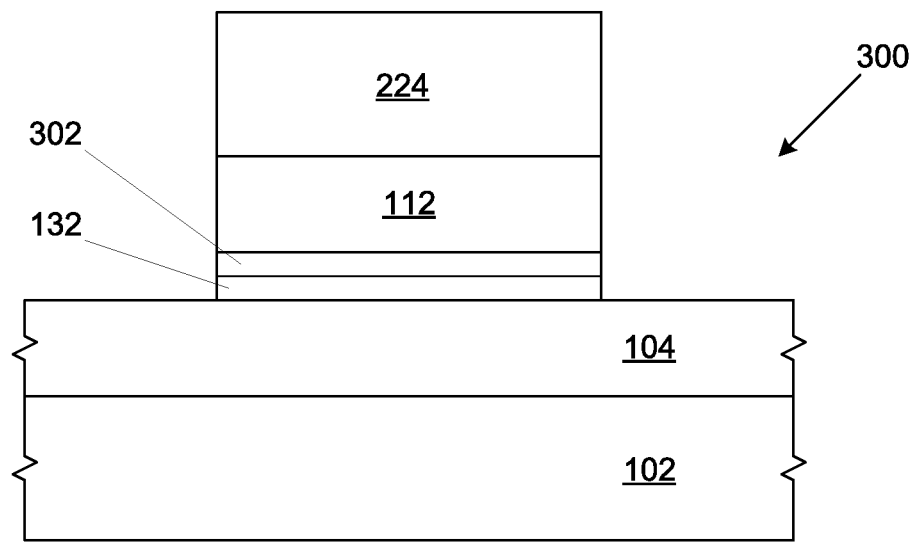
FIG. 6 illustrates side cross sectional view of a microelectronic device having a functional metal oxide channel, according to another embodiment of the present description.

FIG. 6 illustrates a microelectronic device 300 (e.g. a two-terminal microelectronic device), according to yet still another embodiment of the present description. The microelectronic device 300 may comprise the microelectronic substrate 102 having the buffer transition layer 104 thereon. The buffer capping layer 132 may be formed on the buffer transition layer 104. A second electrode 302 may be formed on the buffer capping layer 132. The second electrode 302 may comprise a high work function metal. The functional metal oxide channel 112 may be formed on the second electrode 302 and the first electrode 224 may be formed on the functional metal oxide channel 112. The microelectronic device 300 may used as the selector 1S (see FIG. 8) in a microelectronic circuit 310, which is illustrated in cross-section in FIG. 7 and as a circuit diagram in FIG. 8.

Figure 7:
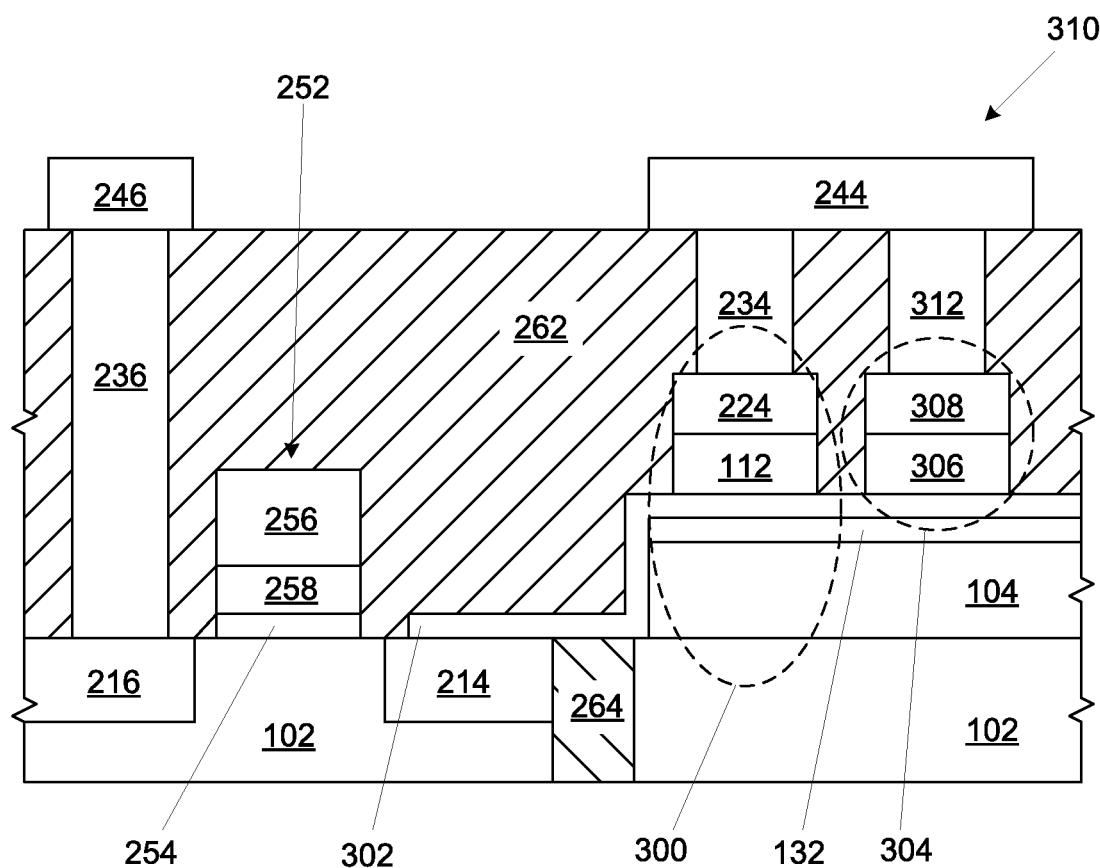
FIG. 7 illustrates side cross sectional view of a microelectronic structure incorporating the microelectronic device of FIG. 6, according to an embodiment of the present description.

As shown in FIG. 7, the microelectronic circuit 310 may comprise the microelectronic transistor gate 252 that may be formed on the microelectronic substrate 102. The microelectronic transistor gate 252 may include the gate electrode 256 with the gate dielectric 254 disposed between the gate electrode 256 and may further include the high work function metal 258 between the gate electrode 256 and the gate dielectric 254. The source region 214 and the drain region 216 may be formed in the microelectronic substrate 102, such as by ion implantation of appropriate dopants, on opposing sides of the microelectronic transistor gate 252. The interlayer dielectric material 262 may be disposed over the microelectronic transistor gate 252 and the drain contact 236 may be formed through the interlayer dielectric material 262 to electrically connect with the drain region 216. As illustrated the drain contact 236 may be electrically connected to the first metallization structure 246 formed on the interlayer dielectric material 262.

The microelectronic device 300 may be formed as part of the microelectronic circuit 310 such that the high work function electrode 302 contacts the substrate 102 at the source region 214 formed therein. The device contact 234 may extend through the interlayer dielectric material 262 to electrically contact the first electrode 224 and the device contact 234 may be electrically connected to the second metallization structure 244 formed on the interlayer dielectric material 262. The microelectronic circuit 310 may further include a capacitor 304 comprising a capacitor dielectric 306 disposed between the second electrode 302 and a capacitor electrode 308, wherein the capacitor electrode 308 is in electrical contact with the second metallization 244 through a capacitor contact 312 extending through the interlayer dielectric layer 262. The capacitor dielectric 306 may be any appropriate dielectric material, including, but not limited to, silicon dioxide, silicon nitride, and high k dielectrics (such as hafnium oxide, titanium oxide, and the like). The capacitor electrode 308 and the capacitor contact 312 may be formed from any appropriate conductive material.

Figure 8:
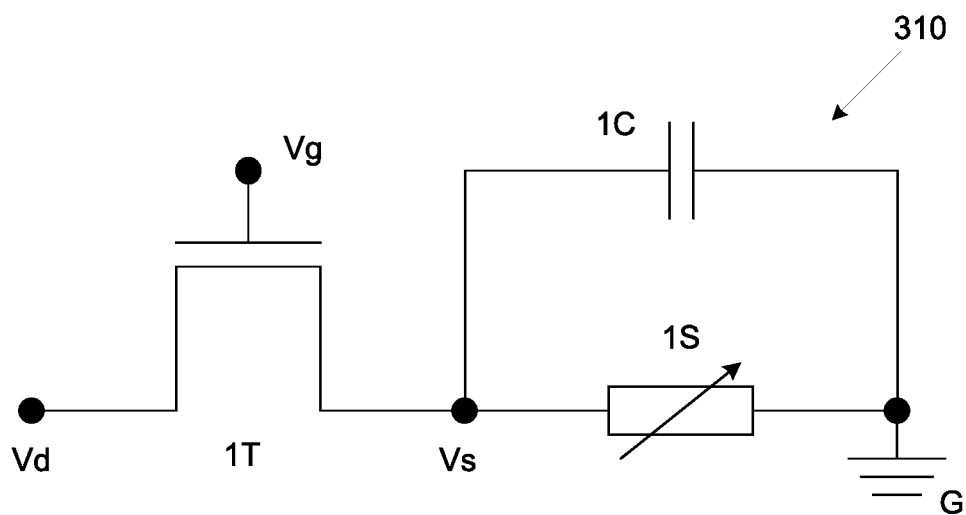
FIG. 8 illustrates a circuit diagram for the microelectronic structure of FIG. 7, according to an embodiment of the present description.

With regard to the circuit diagram of FIG. 8, the microelectronic transistor 1T would correspond to the structure comprising the microelectronic transistor gate 252, the source region 214, the drain region 216, and a portion of the microelectronic substrate 102 between the source region 214 and the drain region 216 of FIG. 7. The drain voltage Vd corresponds to a voltage at the drain region 216 of FIG. 7. The gate voltage Vg corresponds to a voltage at the gate electrode 256 of FIG. 7. The source voltage Vs corresponds to a voltage at the source region 214 of FIG. 7. The selector 1S corresponds to the microelectronic device 300 of FIG. 7. A capacitor 1C corresponds to the capacitor 304 of FIG. 7. The voltage or ground G would correspond to the second metallization 244 being grounded.

For the purpose of the present description, the term "microelectronic apparatus" broadly includes the microelectronic devices and microelectronic circuit described herein.

Figure 9:
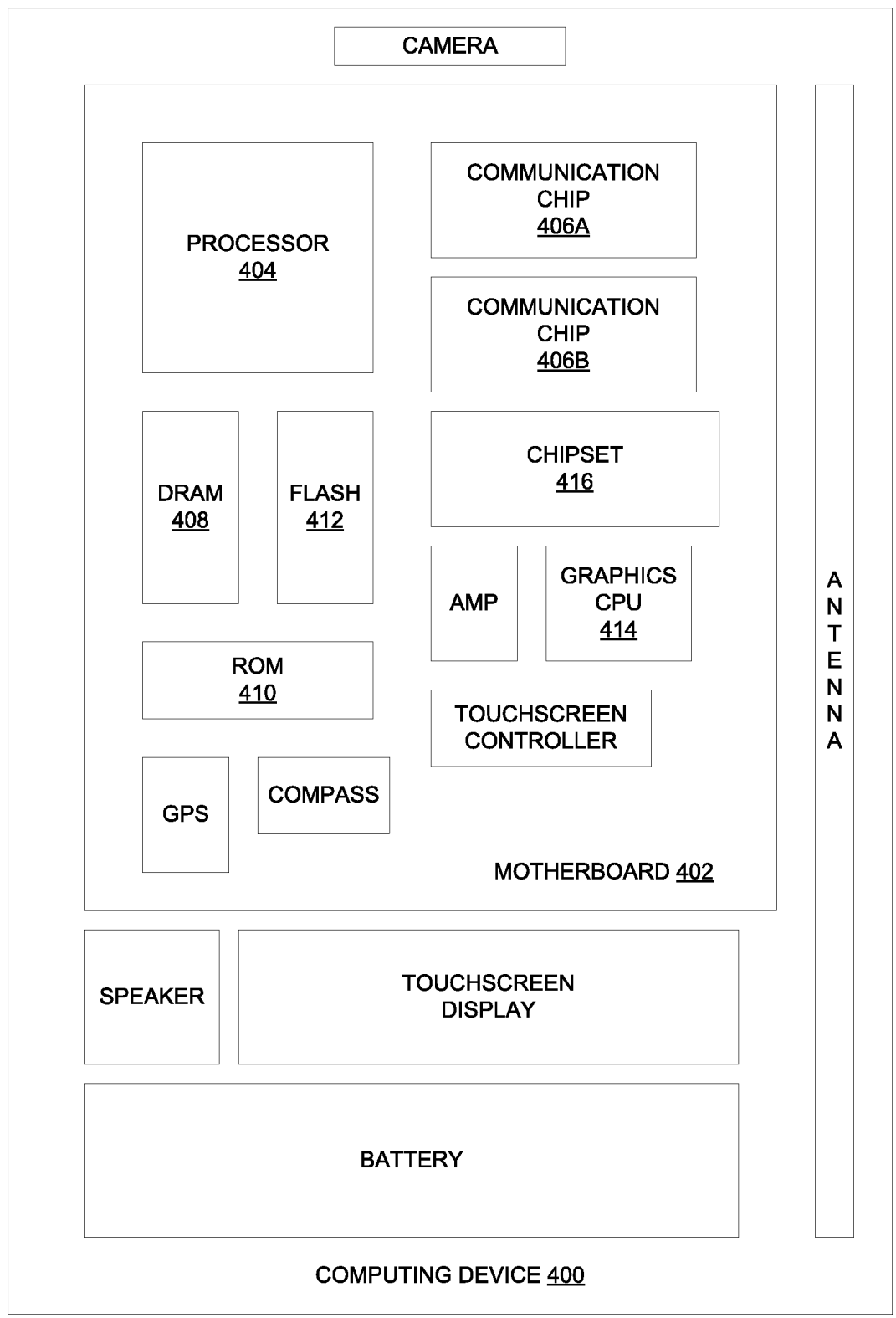
FIG. 9 illustrates a computing device in accordance with one implementation of the present description.

FIG. 9 illustrates a computing device 400 in accordance with one implementation of the present description. The computing device 400 houses a board 402. The board may include a number of microelectronic components, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 402. In some implementations, at least one of the microelectronic components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include at least one microelectronic apparatus having a functional metal oxide channel formed on a microelectronic substrate, such as a silicon microelectronic substrate, as described herein.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-9. The subject matter may be applied to other microelectronic device and assembly applications, as will be understood to those skilled in the art.

The following examples pertain to further embodiments, wherein Example 1 is a microelectronic apparatus, comprising a microelectronic substrate; a buffer transition layer on the microelectronic substrate; a functional metal oxide channel on the buffer transition layer; and an electrode on the functional metal oxide channel.

In Example 2, the subject matter of Example 1 can optionally include a microelectronic transistor source region formed therein, and wherein the buffer transition layer contacts the microelectronic transistor source region.

In Example 3, the subject matter of Example 2 can optionally include the buffer transition layer comprising strontium titanate and the functional metal oxide channel comprising niobium oxide.

In Example 4, the subject matter of Example 1 can optionally include a buffer capping layer between the buffer transition layer and the functional metal oxide channel.

In Example 5, the subject matter of Example 4 can optionally include the buffer transition layer comprising strontium titanate, the buffer capping layer comprising rutile titanium dioxide, and the functional metal oxide channel comprising vanadium oxide.

In Example 6, the subject matter of Example 4 can optionally include a second electrode between the buffer capping layer and the functional metal oxide channel.

In Example 7, the subject matter of Example 6 can optionally include the microelectronic substrate including a microelectronic transistor source region formed therein, and the second electrode contacting the microelectronic transistor source region.

In Example 8, the subject matter of Example 7 can optionally include a capacitor in electrical contact with the second electrode.

In Example 9, the subject matter of Example 8 can optionally include the capacitor and the electrode are in electrical contact with a common metallization.

In Example 10, the subject matter of Example 1 can optionally include a source structure and a drain structure formed on the buffer transition layer, wherein the source structure and the drain structure abut opposing sides of the functional metal oxide channel; and a gate dielectric between the electrode and the functional metal oxide channel.

In Example 11, the subject matter of Example 10 can optionally include a high work function layer between the electrode and the gate dielectric.

In Example 12, the subject matter of Example 10 can optionally include the buffer transition layer comprises strontium titanate and wherein the functional metal oxide channel comprises niobium oxide.

In Example 13, the subject matter of Example 10 can optionally include a buffer capping layer between the buffer transition layer and the functional metal oxide channel.

In Example 14, the subject matter of Example 13 can optionally include the buffer transition layer comprising strontium titanate, the buffer capping layer comprising rutile titanium dioxide, and the functional metal oxide channel comprising vanadium oxide.

In Example 15, the subject matter of Example 1-14 can optionally include the microelectronic substrate comprises a silicon microelectronic substrate.

In Example 16, the subject matter of any of Examples 1, 2, 4, 6-11, and 13 can optionally include the source line being electrically connected to the buffer transition layer is selected from the group consisting of amorphous oxides, sapphire, and strontium titanate.

The following examples pertain to further embodiments, wherein Example 17 is an electronic system, comprising a board; and a microelectronic component attached to the board, wherein the microelectronic component includes at least one microelectronic apparatus comprising a microelectronic substrate; a buffer transition layer on the microelectronic substrate; a functional metal oxide channel on the buffer transition layer; and an electrode on the functional metal oxide channel.

In Example 18, the subject matter of Example 17 can optionally include a microelectronic transistor source region formed therein, and wherein the buffer transition layer contacts the microelectronic transistor source region.

In Example 19, the subject matter of Example 18 can optionally include the buffer transition layer comprising strontium titanate and the functional metal oxide channel comprising niobium oxide.

In Example 20, the subject matter of Example 17 can optionally include a buffer capping layer between the buffer transition layer and the functional metal oxide channel.

In Example 21, the subject matter of Example 20 can optionally include the buffer transition layer comprising strontium titanate, the buffer capping layer comprising rutile titanium dioxide, and the functional metal oxide channel comprising vanadium oxide.

In Example 22, the subject matter of Example 20 can optionally include a second electrode between the buffer capping layer and the functional metal oxide channel.

In Example 23, the subject matter of Example 22 can optionally include the microelectronic substrate including a microelectronic transistor source region formed therein, and the second electrode contacting the microelectronic transistor source region.

In Example 24, the subject matter of Example 23 can optionally include a capacitor in electrical contact with the second electrode.

In Example 25, the subject matter of Example 24 can optionally include the capacitor and the electrode are in electrical contact with a common metallization.

In Example 26, the subject matter of Example 17 can optionally include a source structure and a drain structure formed on the buffer transition layer, wherein the source structure and the drain structure abut opposing sides of the functional metal oxide channel; and a gate dielectric between the electrode and the functional metal oxide channel.

In Example 27, the subject matter of Example 26 can optionally include a high work function layer between the electrode and the gate dielectric.

In Example 28, the subject matter of Example 26 can optionally include the buffer transition layer comprises strontium titanate and wherein the functional metal oxide channel comprises niobium oxide.

In Example 29, the subject matter of Example 26 can optionally include a buffer capping layer between the buffer transition layer and the functional metal oxide channel.

In Example 30, the subject matter of Example 29 can optionally include the buffer transition layer comprising strontium titanate, the buffer capping layer comprising rutile titanium dioxide, and the functional metal oxide channel comprising vanadium oxide.

In Example 31, the subject matter of Example 17-30 can optionally include the microelectronic substrate comprises a silicon microelectronic substrate.

In Example 32, the subject matter of any of Examples 17, 18, 20, 22-27, and 30 can optionally include the source line being electrically connected to the buffer transition layer is selected from the group consisting of amorphous oxides, sapphire, and strontium titanate.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic apparatus, comprising:
   a microelectronic substrate;
   a buffer transition layer on the microelectronic substrate;
   a functional metal oxide channel on the buffer transition layer; and
   an electrode on the functional metal oxide channel;
   wherein the microelectronic substrate includes a microelectronic transistor source region formed therein, and wherein the buffer transition layer contacts the microelectronic transistor source region.

2. The microelectronic apparatus of claim 1, wherein the microelectronic substrate comprises a silicon microelectronic substrate.

3. The microelectronic apparatus of claim 1, wherein the buffer transition layer comprises strontium titanate and wherein the functional metal oxide channel comprises niobium oxide.

4. A microelectronic apparatus, comprising:
   a microelectronic substrate;
   a buffer transition layer on the microelectronic substrate;
   a functional metal oxide channel on the buffer transition layer;
   an electrode on the functional metal oxide channel; and
   a buffer capping layer between the buffer transition layer and the functional metal oxide channel.

5. The microelectronic apparatus of claim 4, wherein the buffer transition layer comprises strontium titanate, wherein the buffer capping layer comprises rutile titanium dioxide, and wherein the functional metal oxide channel comprises vanadium oxide.

6. The microelectronic apparatus of claim 4, further comprising a second electrode between the buffer capping layer and the functional metal oxide channel.

7. The microelectronic apparatus of claim 6, wherein the microelectronic substrate includes a microelectronic transistor source region formed therein, and wherein the second electrode contacts the microelectronic transistor source region.

8. The microelectronic apparatus of claim 7, further comprising a capacitor in electrical contact with the second electrode.

9. The microelectronic apparatus of claim 8, wherein the capacitor and the electrode are in electrical contact with a common metallization.

10. A microelectronic apparatus, comprising:
    a microelectronic substrate;
    a buffer transition layer on the microelectronic substrate;
    a functional metal oxide channel on the buffer transition layer;
    an electrode on the functional metal oxide channel;
    a source structure and a drain structure formed on the buffer transition layer, wherein the source structure and the drain structure abut opposing sides of the functional metal oxide channel;
    a gate dielectric between the electrode and the functional metal oxide channel; and
    a high work function layer between the electrode and the gate dielectric.

11. The microelectronic apparatus of claim 10, wherein the microelectronic substrate comprises a silicon microelectronic substrate.

12. A microelectronic apparatus, comprising:
    a microelectronic substrate;
    a buffer transition layer on the microelectronic substrate;
    a functional metal oxide channel on the buffer transition layer;

an electrode on the functional metal oxide channel;
a source structure and a drain structure formed on the buffer transition layer, wherein the source structure and the drain structure abut opposing sides of the functional metal oxide channel; and
a gate dielectric between the electrode and the functional metal oxide channel;
wherein the buffer transition layer comprises strontium titanate and wherein the functional metal oxide channel comprises niobium oxide.

13. A microelectronic apparatus, comprising:
a microelectronic substrate;
a buffer transition layer on the microelectronic substrate;
a functional metal oxide channel on the buffer transition layer;
an electrode on the functional metal oxide channel;
a source structure and a drain structure formed on the buffer transition layer, wherein the source structure and the drain structure abut opposing sides of the functional metal oxide channel;
a gate dielectric between the electrode and the functional metal oxide channel; and
a buffer capping layer between the buffer transition layer and the functional metal oxide channel.

14. The microelectronic apparatus of claim 13, wherein the buffer transition layer comprises strontium titanate, wherein the buffer capping layer comprises rutile titanium dioxide, and wherein the functional metal oxide channel comprises vanadium oxide.

15. An electronic system, comprising:
a board; and
a microelectronic component attached to the board, wherein the microelectronic component includes at least one microelectronic apparatus, comprising:
a microelectronic substrate;
a buffer transition layer on the microelectronic substrate;
a functional metal oxide channel on the buffer transition layer; and
an electrode on the functional metal oxide channel;
wherein the microelectronic substrate includes a microelectronic transistor source region formed therein, and wherein the buffer transition layer contacts the microelectronic transistor source region.

16. The electronic system of claim 15, wherein the microelectronic substrate comprises a silicon microelectronic substrate.

17. The electronic system of claim 15, wherein the buffer transition layer comprises strontium titanate and wherein the functional metal oxide channel comprises niobium oxide.

18. An electronic system, comprising:
a board; and
a microelectronic component attached to the board, wherein the microelectronic component includes at least one microelectronic apparatus, comprising:
a microelectronic substrate;
a buffer transition layer on the microelectronic substrate;
a functional metal oxide channel on the buffer transition layer;
an electrode on the functional metal oxide channel; and
a buffer capping layer between the buffer transition layer and the functional metal oxide channel.

19. The electronic system of claim 18, wherein the buffer transition layer comprises strontium titanate, wherein the buffer capping layer comprises rutile titanium dioxide, and wherein the functional metal oxide channel comprises vanadium oxide.

20. The electronic system of claim 18, further comprising a second electrode between the buffer capping layer and the functional metal oxide channel.

21. The electronic system of claim 20, wherein the microelectronic substrate includes a microelectronic transistor source region formed therein, and wherein the second electrode contacts the microelectronic transistor source region.

22. The electronic system of claim 21, further comprising a capacitor in electrical contact with the second electrode.

23. An electronic system, comprising:
a board; and
a microelectronic component attached to the board, wherein the microelectronic component includes at least one microelectronic apparatus, comprising:
a microelectronic substrate;
a buffer transition layer on the microelectronic substrate;
a functional metal oxide channel on the buffer transition layer;
an electrode on the functional metal oxide channel;
a source structure and a drain structure formed on the buffer transition layer, wherein the source structure and the drain structure abut opposing sides of the functional metal oxide channel;
a gate dielectric between the electrode and the functional metal oxide channel; and
a high work function layer between the electrode and the gate dielectric.

24. An electronic system, comprising:
a board; and
a microelectronic component attached to the board, wherein the microelectronic component includes at least one microelectronic apparatus, comprising:
a microelectronic substrate;
a buffer transition layer on the microelectronic substrate;
a functional metal oxide channel on the buffer transition layer;
an electrode on the functional metal oxide channel;
a source structure and a drain structure formed on the buffer transition layer, wherein the source structure and the drain structure abut opposing sides of the functional metal oxide channel; and
a gate dielectric between the electrode and the functional metal oxide channel,
wherein the buffer transition layer comprises strontium titanate and wherein the functional metal oxide channel comprises niobium oxide.

25. An electronic system, comprising:
a board; and
a microelectronic component attached to the board, wherein the microelectronic component includes at least one microelectronic apparatus, comprising:
a microelectronic substrate;
a buffer transition layer on the microelectronic substrate;
a functional metal oxide channel on the buffer transition layer;
an electrode on the functional metal oxide channel;
a source structure and a drain structure formed on the buffer transition layer, wherein the source structure and the drain structure abut opposing sides of the functional metal oxide channel;

a gate dielectric between the electrode and the functional metal oxide channel, and a buffer capping layer between the buffer transition layer and the functional metal oxide channel.

26. The electronic system of claim 25, wherein the buffer transition layer comprises strontium titanate, wherein the buffer capping layer comprises rutile titanium dioxide, and wherein the functional metal oxide channel comprises vanadium oxide.

* * * * *